US010276495B2

(12) United States Patent
Maxim et al.

(10) Patent No.: US 10,276,495 B2
(45) Date of Patent: Apr. 30, 2019

(54) BACKSIDE SEMICONDUCTOR DIE TRIMMING

(71) Applicant: Qorvo US, Inc., Greensboro, NC (US)

(72) Inventors: George Maxim, Saratoga, CA (US); Dirk Robert Walter Leipold, San Jose, CA (US); Julio C. Costa, Oak Ridge, NC (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/262,457

(22) Filed: Sep. 12, 2016

(65) Prior Publication Data

US 2017/0077028 A1  Mar. 16, 2017

Related U.S. Application Data

(60) Provisional application No. 62/217,430, filed on Sep. 11, 2015.

(51) Int. Cl.
*H01L 23/525* (2006.01)
*H01L 21/683* (2006.01)

(52) U.S. Cl.
CPC ...... *H01L 23/5258* (2013.01); *H01L 21/6835* (2013.01)

(58) Field of Classification Search
CPC ......... H01L 2924/00; H01L 2924/0002; H01L 2924/00014; H01L 23/5256; H01L 2924/014; H01L 2224/13144; H01L 2924/181

See application file for complete search history.

(56) References Cited

U.S. PATENT DOCUMENTS

| 4,093,562 A | 6/1978 | Kishimoto |
|---|---|---|
| 4,366,202 A | 12/1982 | Borovsky |
| 5,061,663 A | 10/1991 | Bolt et al. |
| 5,069,626 A | 12/1991 | Patterson et al. |
| 5,391,257 A | 2/1995 | Sullivan et al. |
| 5,459,368 A | 10/1995 | Onishi et al. |
| 5,646,432 A | 7/1997 | Iwaki et al. |

(Continued)

FOREIGN PATENT DOCUMENTS

| CN | 103811474 A | 5/2014 |
|---|---|---|
| EP | 2996143 A1 | 3/2016 |

(Continued)

OTHER PUBLICATIONS

Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.

(Continued)

*Primary Examiner* — Tony Tran
(74) *Attorney, Agent, or Firm* — Withrow & Terranova, P.L.L.C.

(57) ABSTRACT

A semiconductor die including a substrate, a device layer over the substrate, and an adjustable component in the device layer is provided, where a surface of the device layer opposite the substrate is the frontside of the semiconductor die. At least a portion of the substrate is removed to expose a backside of the semiconductor die opposite the frontside. The adjustable component is then trimmed through the backside of the semiconductor die.

18 Claims, 16 Drawing Sheets

(56) References Cited

U.S. PATENT DOCUMENTS

| | | |
|---|---|---|
| 5,648,013 A | 7/1997 | Uchida et al. |
| 5,699,027 A | 12/1997 | Tsuji et al. |
| 5,709,960 A | 1/1998 | Mays et al. |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,423,570 B1 | 7/2002 | Ma et al. |
| 6,426,559 B1 | 7/2002 | Bryan et al. |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,960,218 B2 | 6/2011 | Ma et al. |
| 8,004,089 B2 | 8/2011 | Jobetto |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,963,321 B2 | 2/2015 | Lenniger et al. |
| 8,983,399 B2 | 3/2015 | Kawamura et al. |
| 9,165,793 B1 | 10/2015 | Wang et al. |
| 9,349,700 B2 | 5/2016 | Hsieh et al. |
| 9,368,429 B2 | 6/2016 | Ma et al. |
| 9,461,001 B1 | 10/2016 | Tsai et al. |
| 9,520,428 B2 | 12/2016 | Fujimori |
| 9,646,856 B2 | 5/2017 | Meyer et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0105496 A1 | 5/2006 | Chen et al. |
| 2006/0108585 A1 | 5/2006 | Gan et al. |
| 2006/0261446 A1 | 11/2006 | Wood et al. |
| 2007/0020807 A1 | 1/2007 | Geefay et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1* | 5/2010 | Ding ............... H01L 23/5258 257/529 |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakitirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1* | 6/2013 | Kim ............... H01L 23/5256 257/529 |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0035129 A1 | 2/2014 | Stuber et al. |
| 2014/0134803 A1 | 5/2014 | Kelly et al. |

(56) References Cited

U.S. PATENT DOCUMENTS

| | | |
|---|---|---|
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1* | 11/2014 | Jung ............... H01L 24/96 257/774 |
| 2014/0346573 A1 | 11/2014 | Adam et al. |
| 2015/0115416 A1 | 4/2015 | Costa et al. |
| 2015/0130045 A1 | 5/2015 | Tseng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0155706 A1 | 6/2016 | Yoneyama et al. |
| 2016/0284568 A1 | 9/2016 | Morris et al. |
| 2016/0362292 A1 | 12/2016 | Chang et al. |
| 2017/0190572 A1 | 7/2017 | Pan et al. |

FOREIGN PATENT DOCUMENTS

| | | |
|---|---|---|
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.

Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.

Non-Final Office Action for U.S. Appl. No. 15/173,037, dated Jan. 10, 2017, 8 pages.

Non-Final Office Action for U.S. Appl. No. 14/885,202, dated Apr. 14, 2016, 5 pages.

Final Office Action for U.S. Appl. No. 14/885,202, dated Sep. 27, 2016, 7 pages.

Advisory Action for U.S. Appl. No. 14/885,202, dated Nov. 29, 2016, 3 pages.

Notice of Allowance for U.S. Appl. No. 14/885,202, dated Jan. 27, 2017, 7 pages.

Notice of Allowance for U.S. Appl. No. 14/885,243, dated Aug. 31, 2016, 8 pages.

Notice of Allowance for U.S. Appl. No. 14/715,830, dated Feb. 10, 2017, 8 pages.

Notice of Allowance for U.S. Appl. No. 14/715,830, dated Mar. 2, 2017, 8 pages.

Non-Final Office Action for U.S. Appl. No. 15/085,185, dated Feb. 15, 2017, 10 pages.

Non-Final Office Action for U.S. Appl. No. 15/293,947, dated Apr. 7, 2017, 12 pages.

Notice of Allowance for U.S. Appl. No. 14/851,652, dated Apr. 11, 2017, 9 pages.

Final Office Action for U.S. Appl. No. 15/173,037, dated May 2, 2017, 13 pages.

Non-Final Office Action for U.S. Appl. No. 15/353,346, dated May 23, 2017, 15 pages.

Non-Final Office Action for U.S. Appl. No. 15/085,185, dated Jun. 6, 2017, 5 pages.

Applicant-Initiated Interview Summary for U.S. Appl. No. 13/852,648, dated Jan. 27, 2014, 4 pages.

Advisory Action for U.S. Appl. No. 13/852,648, dated Mar. 7, 2014, 4 pages.

Notice of Allowance for U.S. Appl. No. 13/852,648, dated Jun. 16, 2014, 9 pages.

Notice of Allowance for U.S. Appl. No. 13/852,648, dated Sep. 26, 2014, 8 pages.

Notice of Allowance for U.S. Appl. No. 13/852,648, dated Jan. 22, 2015, 8 pages.

Non-Final Office Action for U.S. Appl. No. 13/852,648, dated Jun. 24, 2015, 20 pages.

Final Office Action for U.S. Appl. No. 13/852,648, dated Oct. 22, 2015, 20 pages.

Non-Final Office Action for U.S. Appl. No. 13/852,648, dated Feb. 19, 2016, 12 pages.

Non-Final Office Action for U.S. Appl. No. 14/315,765, dated Jan. 2, 2015, 6 pages.

Final Office Action for U.S. Appl. No. 14/315,765, dated May 11, 2015, 17 pages.

Advisory Action for U.S. Appl. No. 14/315,765, dated Jul. 22, 2015, 3 pages.

Non-Final Office Action for U.S. Appl. No. 14/260,909, dated Mar. 20, 2015, 20 pages.

Final Office Action for U.S. Appl. No. 14/260,909, dated Aug. 12, 2015, 18 pages.

Non-Final Office Action for U.S. Appl. No. 14/261,029, dated Dec. 5, 2014, 15 pages.

Notice of Allowance for U.S. Appl. No. 14/261,029, dated Apr. 27, 2015, 10 pages.

Corrected Notice of Allowability for U.S. Appl. No. 14/261,029, dated Nov. 17, 2015, 5 pages.

Non-Final Office Action for U.S. Appl. No. 14/529,870, dated Feb. 12, 2016, 14 pages.

Non-Final Office Action for U.S. Appl. No. 14/715,830, dated Apr. 13, 2016, 16 pages.

Extended European Search Report for European Patent Application No. 15184861.1, dated Jan. 25, 2016, 6 pages.

Non-Final Office Action for U.S. Appl. No. 12/906,689, dated May 27, 2011, 13 pages.

Non-Final Office Action for U.S. Appl. No. 12/906,689, dated Nov. 4, 2011, 20 pages.

Search Report for Japanese Patent Application No. 2011-229152, dated Feb. 22, 2013, 58 pages.

Office Action for Japanese Patent Application No. 2011-229152, dated May 10, 2013, 7 pages.

Final Rejection for Japanese Patent Application No. 2011-229152, dated Oct. 25, 2013, 2 pages.

Final Office Action for U.S. Appl. No. 13/852,648, dated Jul. 20, 2016, 14 pages.

Notice of Allowance for U.S. Appl. No. 14/529,870, dated Jul. 15, 2016, 8 pages.

Office Action of the Intellectual Property Office for Taiwanese Patent Application No. 104130224, dated Jun. 15, 2016, 9 pages.

Author Unknown, "Fully Sintered Ferrite Powders," Powder Processing and Technology, LLC, Date Unknown, 1 page.

Author Unknown, "Hysol UF3808," Henkel Corporation, Technical Data Sheet, May 2013, 2 pages.

Final Office Action for U.S. Appl. No. 14/715,830, dated Sep. 6, 2016, 13 pages.

Advisory Action for U.S. Appl. No. 14/715,830, dated Oct. 31, 2016, 6 pages.

(56) References Cited

OTHER PUBLICATIONS

Non-Final Office Action for U.S. Appl. No. 14/851,652, dated Oct. 7, 2016, 10 pages.
Notice of Allowance for U.S. Appl. No. 14/959,129, dated Oct. 11, 2016, 8 pages.
International Search Report and Written Opinion for PCT/US2016/045809, dated Oct. 7, 2016, 11 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Heat Transfer," Cool Polymers, Inc., 2006, http://www.coolpolymers.com/heattrans.html, 2 pages.
Author Unknown, "Plastics that Conduct Heat," Plastics Technology Online, Jun. 2001, Retrieved Jun. 24, 2013, http://www.ptonline.com/articles/plastics-that-conduct-heat, 4 pages.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.

(56) References Cited

OTHER PUBLICATIONS

Raskin, Jean-Pierre et al., "Substrate Crosstalk Reduction Using SOI Technology," IEEE Transactions on Electron Devices, vol. 44, No. 12, Dec. 1997, pp. 2252-2261.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Rong, B., et al., "Surface-Passivated High-Resistivity Silicon Substrates for RFICs," IEEE Electron Device Letters, vol. 25, No. 4, Apr. 2004, pp. 176-178.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Corrected Notice of Allowance for U.S. Appl. No. 14/851,652, dated Sep. 6, 2017, 5 pages.
Notice of Allowance for U.S. Appl. No. 15/229,780, dated Oct. 3, 2017, 7 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Notice of Allowance for U.S. Appl. No. 15/353,346, dated Sep. 25, 2017, 9 pages.
Supplemental Notice of Allowability for U.S. Appl. No. 15/287,273, dated Sep. 7, 2017, 5 pages.
Non-Final Office Action for U.S. Appl. No. 15/652,867, dated Oct. 10, 2017, 5 pages.
U.S. Appl. No. 15/616,109, filed Jun. 7, 2017.
U.S. Appl. No. 14/885,202, filed Oct. 16, 2015.
U.S. Appl. No. 14/885,243, filed Oct. 16, 2015, now U.S. Pat. No. 9,530,709.
U.S. Appl. No. 15/387,855, filed Dec. 22, 2016.
U.S. Appl. No. 15/648,082, filed Jul. 12, 2017.
Non-Final Office Action for U.S. Appl. No. 15/795,915, dated Feb. 23, 2018, 6 pages.
Non-Final Office Action for U.S. Appl. No. 15/387,855, dated Jan. 16, 2018, 7 pages.
Supplemental Notice of Allowability for U.S. Appl. No. 15/287,273, dated Jan. 17, 2018, 5 pages.
Supplemental Notice of Allowability for U.S. Appl. No. 15/287,273, dated Feb. 23, 2018, 5 pages.
Notice of Allowance for U.S. Appl. No. 15/498,040, dated Feb. 20, 2018, 8 pages.
Non-Final Office Action for U.S. Appl. No. 15/491,064, dated Jan. 2, 2018, 9 pages.
Non-Final Office Action for U.S. Appl. No. 15/676,415, dated Mar. 27, 2018, 14 pages.
Non-Final Office Action for U.S. Appl. No. 15/676,621, dated Mar. 26, 2018, 16 pages.
International Preliminary Report on Patentability for PCT/US2016/045809, dated Feb. 22, 2018, 8 pages.
Bernheim et al., "Chapter 9: Lamination," Tools and Manufacturing Engineers Handbook (book), Apr. 1, 1996, Society of Manufacturing Engineers, p. 9-1.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Final Office Action for U.S. Appl. No. 15/616,109, dated Apr. 19, 2018, 18 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/676,693, dated Jul. 20, 2018, 8 pages.
Corrected Notice of Allowance for U.S. Appl. No. 15/676,693, dated Aug. 29, 2018, 5 pages.
Notice of Allowance for U.S. Appl. No. 15/914,538, dated Aug. 1, 2018, 9 pages.
Notice of Allowance for U.S. Appl. No. 15/293,947, dated Aug. 14, 2017, 7 pages.
Corrected Notice of Allowance for U.S. Appl. No. 14/851,652, dated Jul. 24, 2017, 6 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/229,780, dated Jun. 30, 2017, 12 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Notice of Allowance for U.S. Appl. No. 14/885,202, dated Jul. 24, 2017, 8 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.
Non-Final Office Action for U.S. Appl. No. 15/992,613, dated Feb. 27, 2019, 15 pages.

(56) References Cited

OTHER PUBLICATIONS

Notice of Allowance for U.S. Appl. No. 15/695,579, dated Mar. 20, 2019, 8 pages.
Non-Final Office Action for U.S. Appl. No. 15/695,579, dated Jan. 28, 2019, 8 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.

* cited by examiner

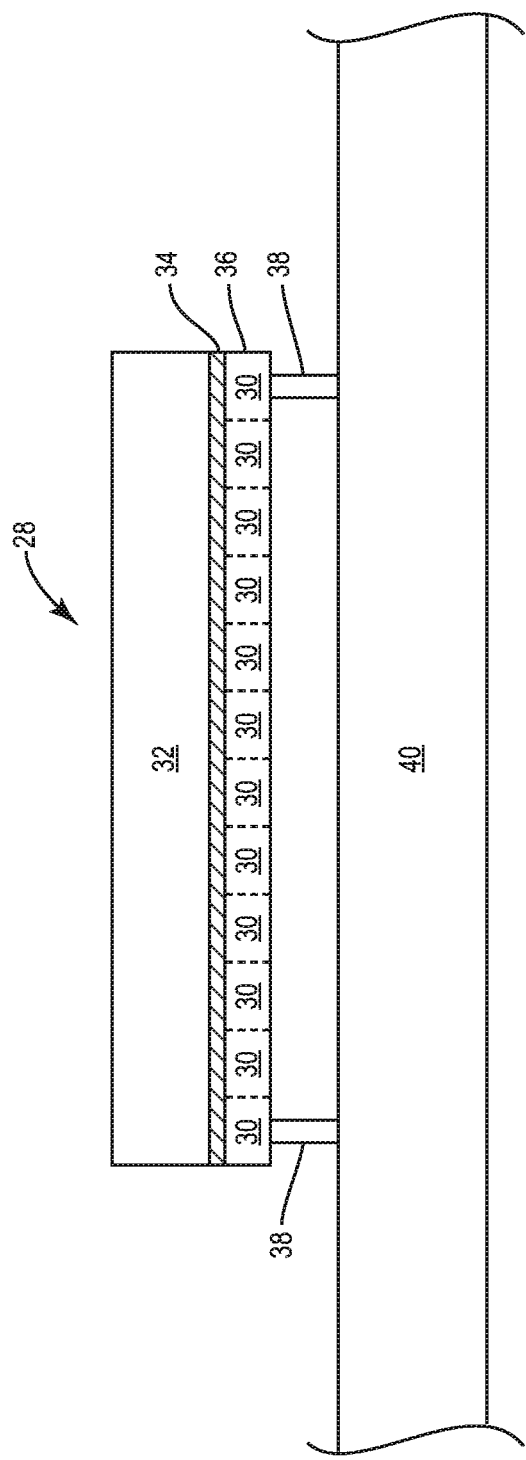

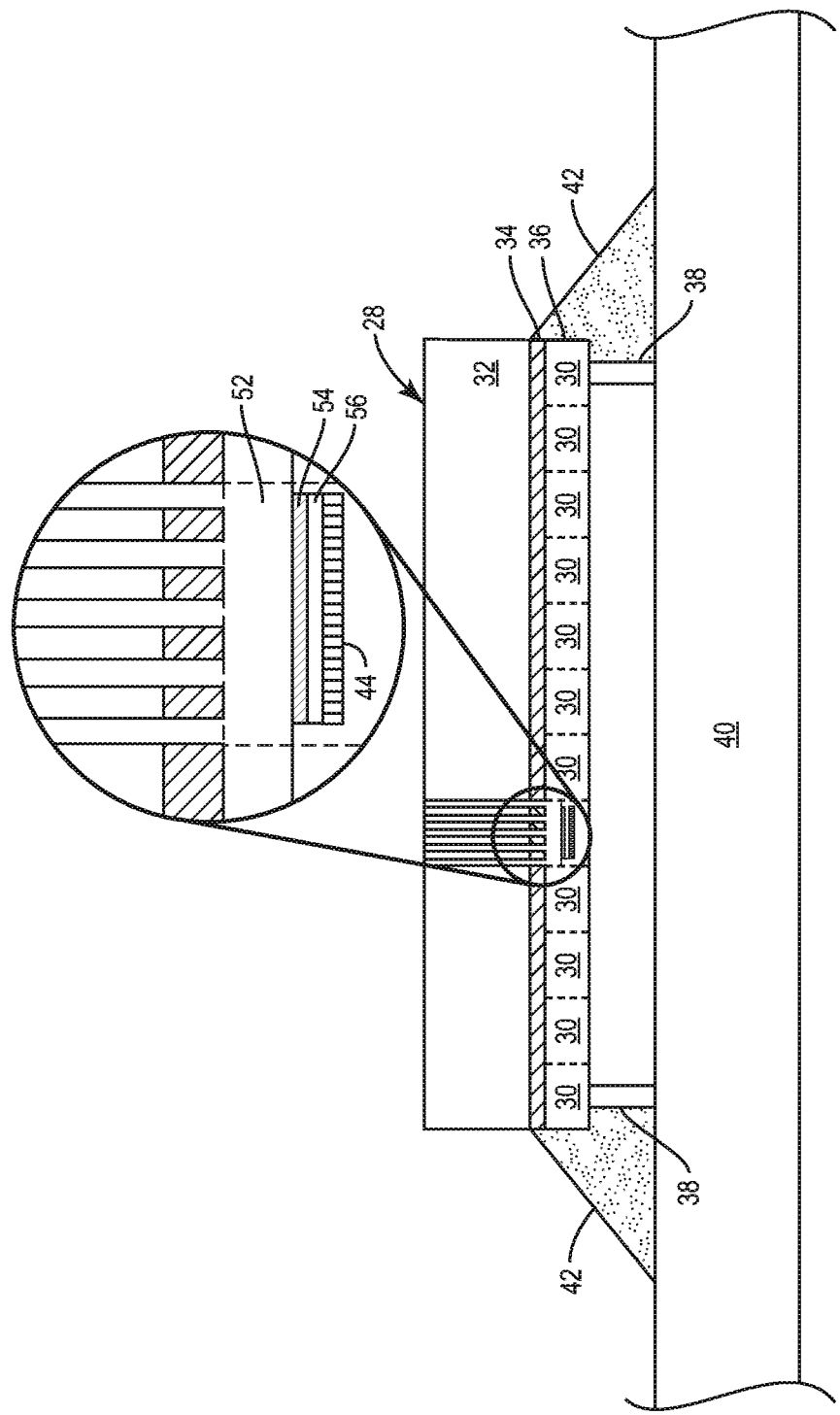

BACKSIDE SEMICONDUCTOR DIE TRIMMING

RELATED APPLICATIONS

This application claims the benefit of U.S. provisional patent application No. 62/217,430, filed Sep. 11, 2015, the disclosure of which is incorporated herein by reference in its entirety.

FIELD OF THE DISCLOSURE

The present disclosure relates to improved methods for trimming components in a circuit formed on a semiconductor die in order to adjust one or more operating parameters thereof.

BACKGROUND

Trimming is a post-manufacturing technique for adjusting one or more operating parameters of a circuit provided on a semiconductor die. When forming a circuit on a semiconductor die, there are numerous variables that may affect the operation thereof. Accordingly, sensitive circuits such as radio frequency (RF) circuits are often manufactured including a number of passive components whose resistance, capacitance, and/or inductance may be adjusted and/or a number of active components (e.g., field effect transistors, bipolar junction transistors, diodes, etc.) whose size may be adjusted via a trimming process. The adjustable passive components are provided with a number of "fuses," usually in the form of small metal traces, which may be cut or destroyed using a laser. By cutting these fuses, the resistance, capacitance, and/or inductance of the adjustable component is changed to a desired value. Similarly, by removing various portions of the active components, a size thereof may be adjusted. Accordingly, one or more operating parameters of the circuit may be adjusted, such that changes in the operation of the circuit due to external factors such as parasitics, manufacturing intolerances, mechanical stress, carrier-die interactions, and the like may be compensated for.

FIG. 1 shows a conventional adjustable resistor 10 whose resistance value may be changed via trimming. The conventional adjustable resistor 10 includes a number of resistive elements R1-R5 and a number of fuses F1-F3. While the resistance of the conventional adjustable resistor 10 is initially set at R1+R2, any of the fuses F1-F3 may be cut in order to add to the resistance of the conventional adjustable resistor 10 as desired. For example, a first fuse F1 may be cut such that the resistance of the conventional adjustable resistor 10 is set at R1+R2+R3. The remaining fuses F2 and F3 may similarly be cut in order to add to the resistance of the conventional adjustable resistor 10.

In order to trim components on a semiconductor die, the components generally must be accessible by a laser. That is, the components must be visible through a transparent or semi-transparent material or openly exposed to the outside environment such that the laser can reach the portions thereof available for trimming. Accordingly, trimming generally occurs through a frontside of a semiconductor die on which the components are either surrounded by a transparent or semi-transparent material, such as an oxide or thin-film semiconductor layer, or openly exposed. A backside of the semiconductor die is generally covered by a thick opaque semiconductor die material and thus trimming cannot occur through it. FIGS. 2 and 3A-3C illustrate a conventional trimming process.

First, a semiconductor die 12 including a number of components 14 coupled together to form a circuit is provided (step 100 and FIG. 3A). The semiconductor die 12 shown in FIG. 3A is a semiconductor-on-insulator (SOI) semiconductor die including a substrate 16, an insulating layer 18 over the substrate 16, and a device layer 20 over the insulating layer 18. The components 14 are formed in the device layer 20, and are separated from the substrate 16 by the insulating layer 18. A number of conductive pillars 22 extend above the device layer 20 in order to connect the semiconductor die 12 to a carrier such as a printed circuit board (PCB), as discussed below. The surface of the device layer 20 opposite the insulating layer 18 provides a frontside of the semiconductor die 12, while the surface of the substrate 16 opposite the insulating layer 18 provides a backside of the semiconductor die 12.

One or more of the components 14 are then trimmed using a laser trimming process from the frontside of the semiconductor die 12 (step 102 and FIG. 3B). Specifically, a laser 24 is focused on one or more fuses (not shown) in one or more of the components 14 that are either openly exposed or exposed through a transparent or semi-transparent material in order to cut or destroy the fuses and thus adjust the resistance, capacitance, and/or inductance of the one or more components 14. The semiconductor die 12 is then flipped and attached to a carrier 26 such as a PCB (step 104 and FIG. 3C).

Performing the trimming process as described above suffers from several disadvantages. When the semiconductor die 12 is flipped and attached to the carrier 26, the operating parameters of the circuit formed by the components 14 may significantly change due to parasitics between the semiconductor die 12 and the carrier 26, mechanical stress, and other variables. However, since the components 14 are only available for trimming via the frontside of the semiconductor die 12 (i.e., since the components 14 are only accessible by the laser 24 from the frontside of the semiconductor die 12), the resistance, capacitance, and/or inductance of the components 14 can no longer be adjusted after the device is mounted on the carrier 26. Accordingly, these changes in the operating parameters of the circuit formed by the components cannot be compensated for.

In addition to the above, trimming the components 14 from the frontside of the semiconductor die 12 may require significant energy when the components are located at a significant depth within the device layer 20, since the energy required to cut or destroy a fuse is proportional to a depth of the fuse in the material in which it is surrounded and the thickness of the metal used to form the fuse. Generally, the closer the metal layer to the backside of the semiconductor die 12, the more energy required to trim the metal layer. Cutting or destroying a fuse generally results in damage to the area surrounding the fuse. An increase in the amount of energy required to cut or destroy a fuse results in a proportional increase in the severity of the damaged area and the size of the damaged area. Accordingly, trimming the components 14 from the frontside of the semiconductor die 12 may result in a significant amount of damage to the areas surrounding the fuses, and thus may decrease the performance of the semiconductor die 12. Due to the relatively large amount of energy used in the conventional trimming process, the fuses in the components 14 of the semiconductor die 12 are often spaced to ensure that damage from the trimming process does not affect the operating of the device.

This often results in a large area required for the fuses, thereby increasing the size of the components 14 and the semiconductor die 12.

In light of the above, there is a need for improved methods for trimming components formed on a semiconductor die in order to adjust one or more operating parameters thereof.

SUMMARY

The present disclosure relates to improved methods for trimming components in a circuit formed on a semiconductor die in order to adjust one or more operating parameters thereof. In one embodiment, a method begins by providing a semiconductor die including a substrate, a device layer over the substrate, and an adjustable component in the device layer. A surface of the device layer opposite the substrate is the frontside of the semiconductor die. Next, at least a portion of the substrate is removed to expose a backside of the semiconductor die opposite the frontside. The adjustable component is then trimmed through the backside of the semiconductor die. By trimming the adjustable component through the backside, the adjustable component may be trimmed after the semiconductor die is mounted to a carrier, thereby allowing the trimming to compensate for changes in the operation of a circuit in which the adjustable component is provided due to interactions between the semiconductor die and the carrier. Further, fuses in the adjustable component located closer to the backside of the semiconductor die may be trimmed using less energy, thereby creating less damage during the trimming process and allowing the fuses to be located closer together in order to reduce the area of the adjustable component.

In one embodiment, a method includes the steps of providing a semiconductor die with an adjustable component, thinning at least a portion of material located between one or more fuses in the adjustable component and a surface of the semiconductor die, and trimming the adjustable component. By first thinning the material located between the one or more fuses in the adjustable component and the surface of the semiconductor die before trimming the adjustable component, damage caused by the trimming process may be significantly decreased. Accordingly, the density of features of the adjustable component may be increased without increasing unintentional damage to the device during the trimming process.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 5A through 5D are figures illustrating a trimming process for a semiconductor die according to one embodiment of the present disclosure.

FIGS. 7A through 7C are figures illustrating aspects of a trimming process for a semiconductor die according to one embodiment of the present disclosure.

DETAILED DESCRIPTION

Figure 1:
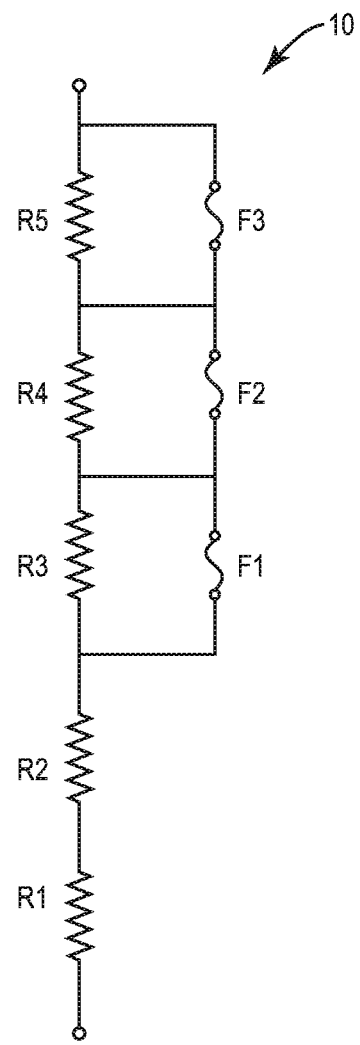
FIG. 1 is a functional schematic illustrating a conventional adjustable component.
Figure 2:
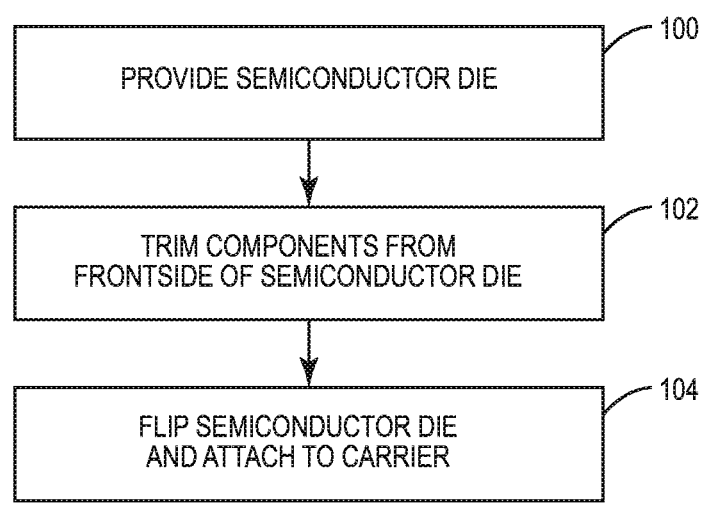
FIG. 2 is a flow chart illustrating a conventional trimming process for a semiconductor die.
Figure 3A:
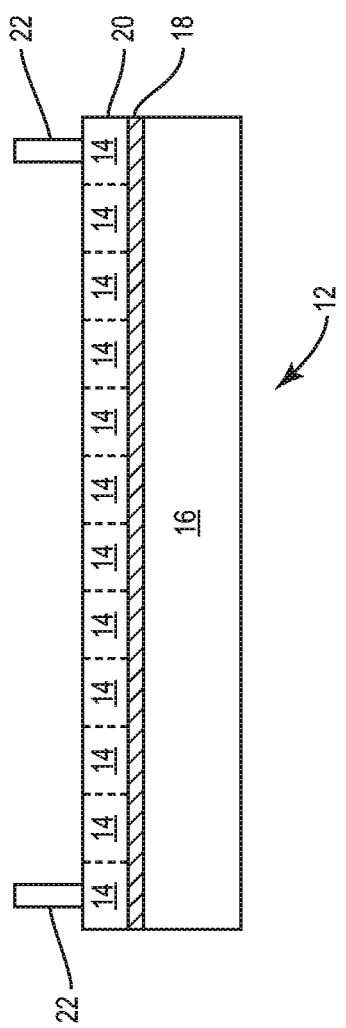
FIGS. 3A through 3C are figures illustrating a conventional trimming process for a semiconductor die.
Figure 3B:
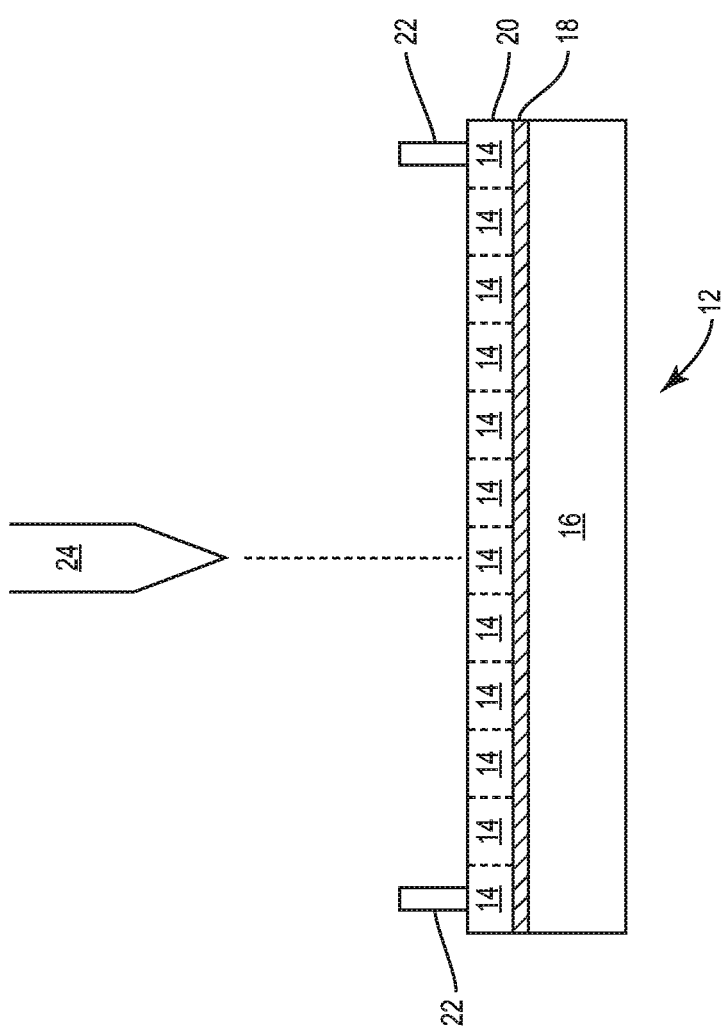
Figure 3C:
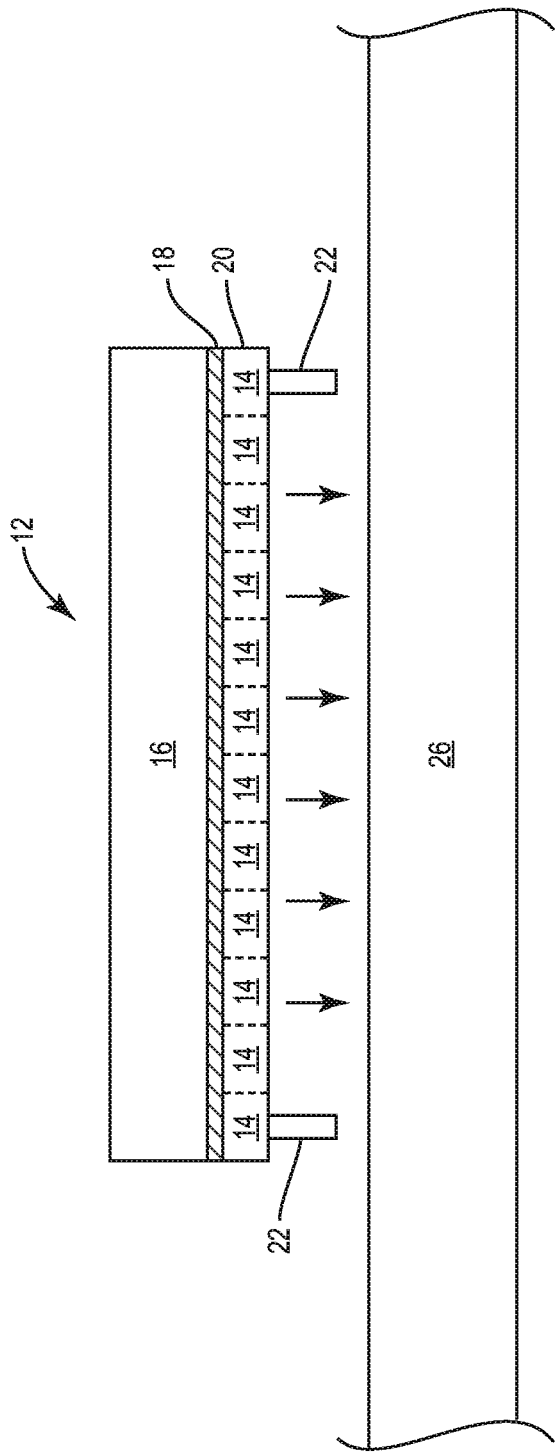
Figure 4:
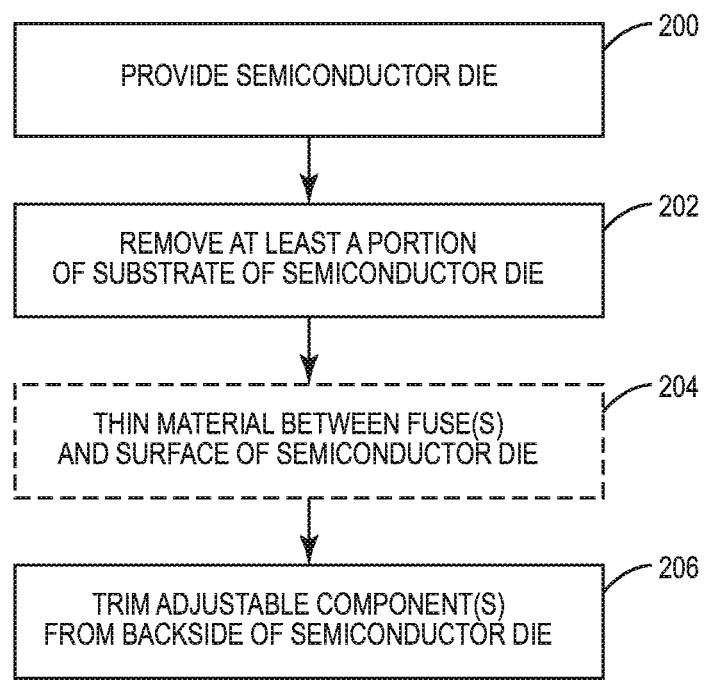
FIG. 4 is a flow chart illustrating a trimming process for a semiconductor die according to one embodiment of the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

The present disclosure relates to improved methods for trimming components in a circuit formed on a semiconductor die in order to adjust one or more operating parameters thereof. In one embodiment, a method begins by providing a semiconductor die including a substrate, a device layer over the substrate, and an adjustable component in the device layer. A surface of the device layer opposite the substrate is the frontside of the semiconductor die. Next, at least a portion of the substrate is removed to expose a backside of the semiconductor die opposite the frontside. The adjustable component is then trimmed through the backside of the semiconductor die. By trimming the adjustable component through the backside, the adjustable component may be trimmed after the semiconductor die is mounted to a carrier, thereby allowing the trimming to compensate for changes in the operation of a circuit in which the adjustable component is provided due to interactions between the semiconductor die and the carrier. Further, fuses in the adjustable component located closer to the backside of the semiconductor die may be trimmed using less energy, thereby creating less damage during the trimming process and allowing the fuses to be located closer together in order to reduce the area of the adjustable component.

In one embodiment, a method includes the steps of providing a semiconductor die with an adjustable component, thinning at least a portion of material located between one or more fuses in the adjustable component and a surface of the semiconductor die, and trimming the adjustable component. By first thinning the material located between the one or more fuses in the adjustable component and the surface of the semiconductor die before trimming the adjustable component, damage caused by the trimming process may be significantly decreased. Accordingly, the density of features of the adjustable component may be increased without increasing unintentional damage to the device during the trimming process.

FIGS. 4 and 5A through 5C illustrate a trimming process according to one embodiment of the present disclosure. First, a semiconductor die 28 including a number of components 30 coupled together to form a circuit is provided (step 200 and FIG. 5A). At least one of the components 30 is an adjustable component including a number of fuses (not shown) configured to be cut or destroyed via a trimming process in order to change a resistance, a capacitance, an inductance, and/or a size of the adjustable component. The semiconductor die 28 is a silicon-on-insulator (SOI) semiconductor die including a substrate 32, an insulating layer 34 over the substrate 32, and a device layer 36 over the insulating layer 34. The components 30 are formed in the device layer 36 and separated from the substrate 32 by the insulating layer 34. A number of conductive pillars 38 extend above the device layer 36 in order to connect the semiconductor die 28 to a carrier 40. The surface of the device layer 36 opposite the insulating layer 34 provides a frontside of the semiconductor die 28, while a surface of the insulating layer 34 opposite the device layer 36 provides a backside of the semiconductor die 28.

While the trimming process herein is described with respect to an SOI semiconductor die, the principles of the present disclosure may be applied to any number of different semiconductor die technologies. Similarly, while the semiconductor die 28 is shown as a flip-chip device, the same principles apply to wirebond devices and other semiconductor die packaging technologies as well. For example, the conductive pillars 38 of the semiconductor die 28 may be replaced with solder balls in various embodiments of the present disclosure.

The carrier 40 may be a printed circuit board (PCB) that connects the semiconductor die 28 to other devices. While the semiconductor die 28 is provided mounted to the carrier 40 for purposes of illustration, any of the steps described in the present process may be carried out before mounting the semiconductor die 28 to the carrier 40 as well. However, one or more of the steps described herein may require that the semiconductor die 28 be mechanically supported. Accordingly, the carrier 40 may be a temporary carrier in some embodiments that is provided to mechanically support the semiconductor die 28 and later removed and replaced with a functional carrier such as a PCB described above.

The components 30 may be any number of different components without departing from the principles of the present disclosure. For example, the components 30 may be transistors such as bipolar junction transistors (BJTs), field effect transistors (FETs), or the like, passive components such as resistors, capacitors, and inductors, micro-electrical-mechanical systems (MEMS) devices, or any other component. These components 30 are generally connected to one another via metal traces in the device layer 36 to form a circuit or a portion of a circuit. The semiconductor die 28 may be produced by an integrated passive device (IPD) process or any other process for providing active devices.

Figure 5B:
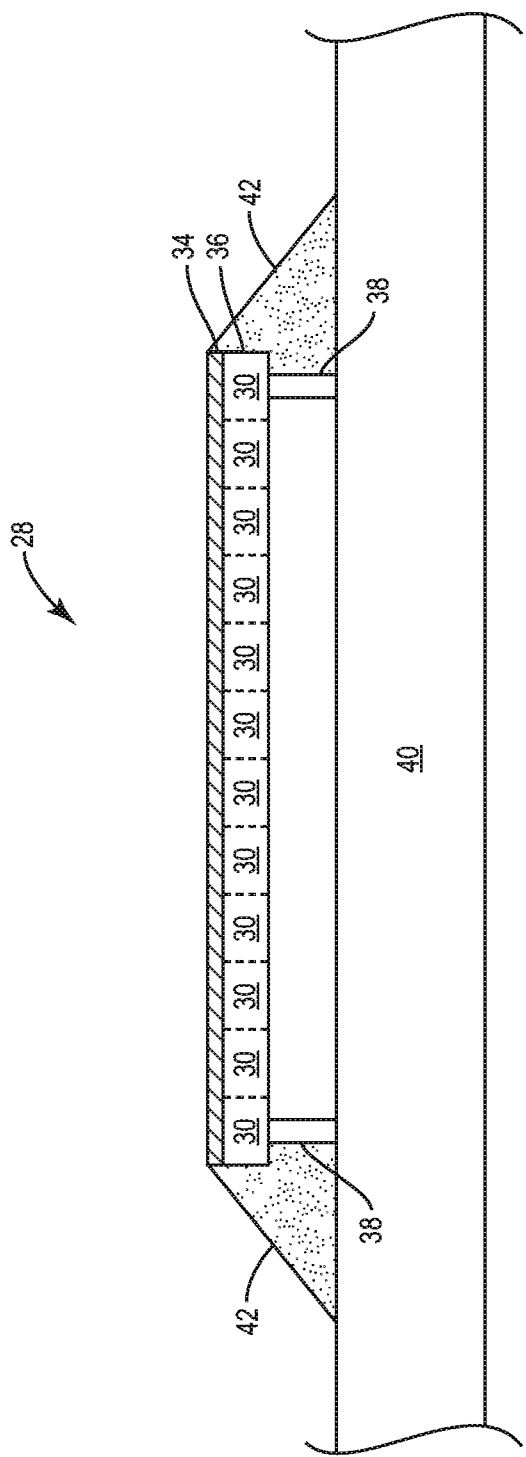

Next, the substrate 32 of the semiconductor die 28 is removed (step 202 and FIG. 5B). Details of removing a substrate from a semiconductor die are discussed in copending and coassigned U.S. patent application Ser. Nos. 14/885,202, now U.S. Pat. No. 10,121,718, and 14/959,129, now U.S. Pat. No. 9,613,831, the contents of which are hereby incorporated by reference in their entirety. As discussed in these applications, the substrate 32 may be removed in a number of different ways. Removing the substrate 32 from the semiconductor die 28 results in several performance advantages due to the fact that the components 30 often undesirably interact with the substrate 32 such that the performance thereof is degraded. To stabilize the semiconductor die 28 with respect to the carrier 40, an underfill material 42 may be provided around the semiconductor die 28 between the frontside thereof and the carrier 40. The underfill material 42 provides mechanical support for the semiconductor die 28.

Removing the substrate 32 exposes the backside of the semiconductor die 28, or the surface of the insulating layer 34 opposite the device layer 36. In embodiments in which the semiconductor die 28 is not an SOI semiconductor die, removing the substrate 32 may simply expose the device layer 36 directly. In general, the insulating layer 34 is an oxide layer that is transparent or semi-transparent, and thus may provide optical access to one or more fuses in the components 30 such that they can be trimmed via the backside of the semiconductor die 28 as discussed below.

Figure 5C:
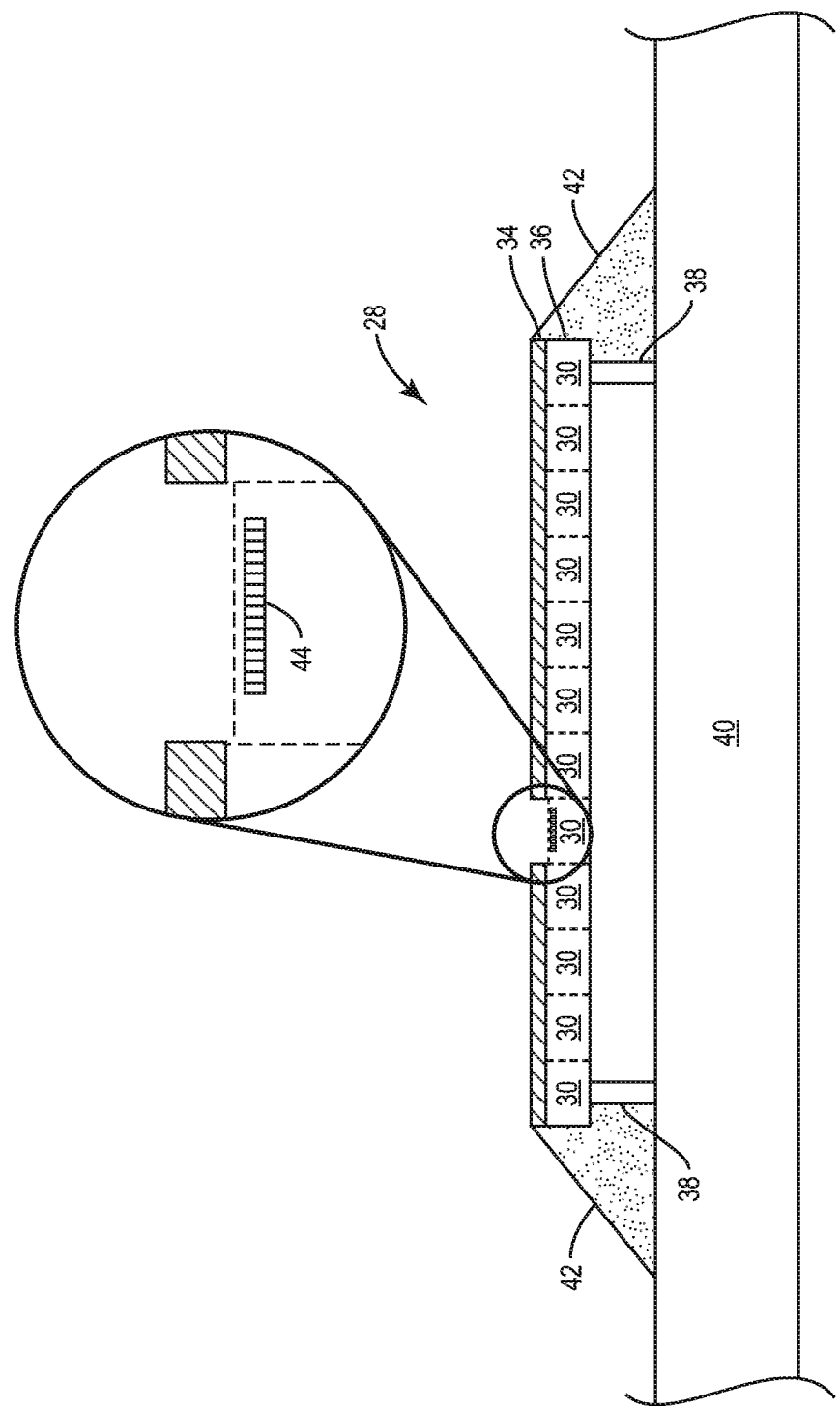

In an optional step, the material located between the backside of the semiconductor die 28 and at least one fuse 44 in an adjustable one of the components 30 may be thinned (step 204 and FIG. 5C). Thinning the material located between the backside of the semiconductor die 28 and a fuse 44 in an adjustable one of the components 30 may include masking the backside of the semiconductor die 28 such that only the area above the fuse 44 is exposed and etching or otherwise damaging the insulating layer 34, or the insulating layer 34 and a portion of the device layer 36, located between the fuse 44 and the backside of the semiconductor die 28. As shown in FIG. 5C, the result may be a thinned insulating layer 34 and/or device layer 36 at the portion thereof located directly above the fuse 44. In some embodiments, a thin backside end of line (BEOL) oxide layer may remain between the fuse 44 and the outside environment, as shown by the dotted line in FIG. 5C. In other embodiments, the fuse 44 is directly exposed to the environment.

Thinning the material between the fuse 44 and the backside of the semiconductor die 28 in this manner may reduce the damage caused by trimming the fuse 44. As will be appreciated by those skilled in the art, trimming a fuse is accomplished by directing a laser onto the metal trace that forms the fuse until the fuse heats and disintegrates, thereby causing a small explosion in the material surrounding the fuse. Since the fuse is often encapsulated by material, the force of this small explosion causes expansion of the surrounding material and thus damage thereto. Accordingly, conventional devices suitable for trimming often have laid out fuses such that they were located relatively far away from one another to avoid unintentional damage to a fuse adjacent to the one being trimmed. By thinning the material between the fuse 44 and the backside of the semiconductor die 28, the small explosion caused by trimming the fuse 44 is allowed to rupture through the backside of the semiconductor die 28, thereby relieving the pressure of the explosion and preventing expansion of the material surrounding the fuse 44. Accordingly, the damage to the material surrounding the fuse 44 caused by trimming is significantly reduced.

While the foregoing step is discussed primarily with respect to thinning the material between the backside of the semiconductor die 28 and the fuse 44, the same principles may be applied to any surface of the semiconductor die 28. That is, the material located between a fuse 44 and the frontside of the semiconductor die 28, or between a fuse 44 and any other surface of the semiconductor die 28 may similarly be thinned in order to reduce the damage caused by trimming the fuse 44. In general, all or a portion of the material located between a fuse 44 and a surface of the semiconductor die 28 may be thinned in order to reduce the damage caused by trimming the fuse 44.

Figure 5D:
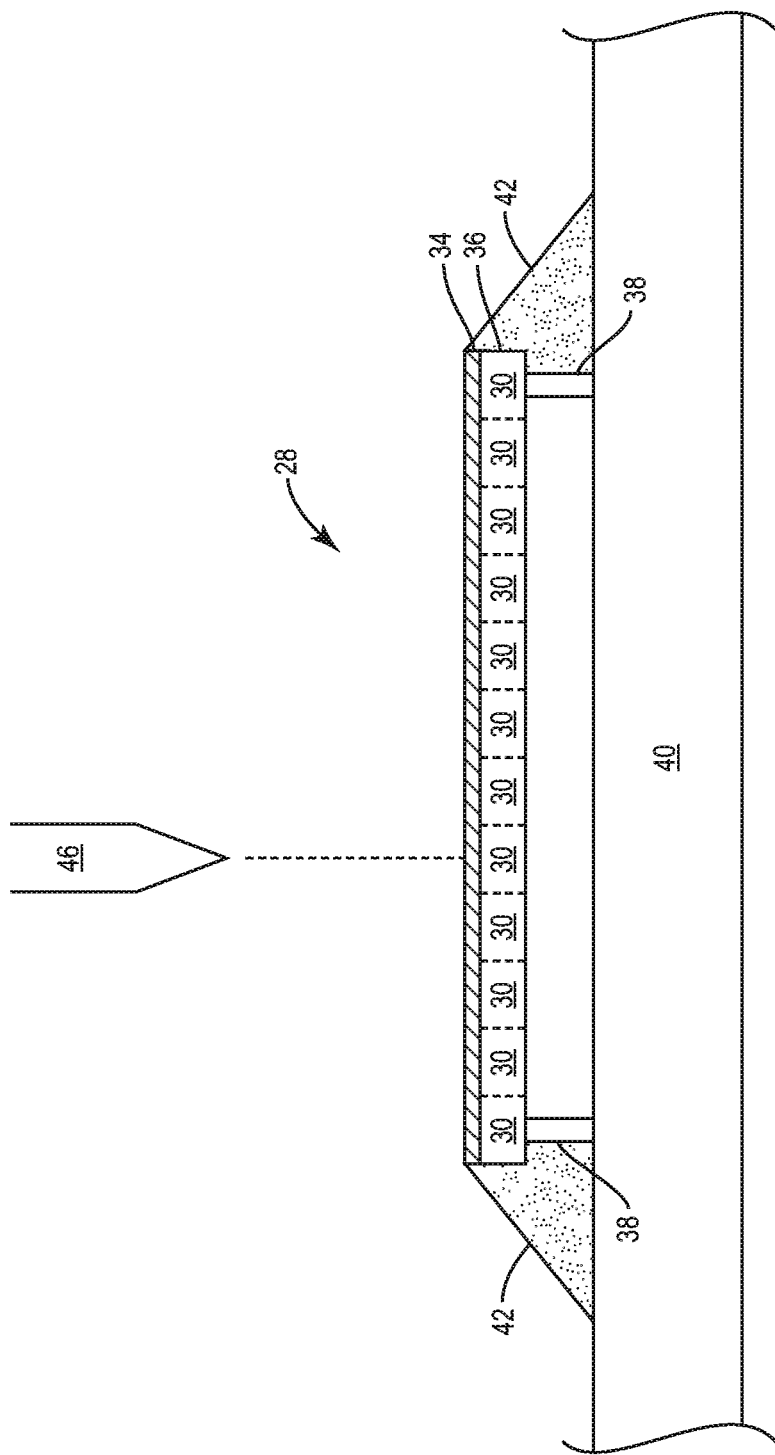

One or more adjustable components in the device layer 36 of the semiconductor die 28 are then trimmed (step 206 and FIG. 5D). Specifically, the one or more adjustable components are trimmed from the backside of the semiconductor die 28. As discussed above, trimming the one or more adjustable components includes directing a laser 46 at one or more fuses 44 in the adjustable components in order to cut or destroy the fuses 44 to change a resistance, capacitance, inductance, and/or size of the components. All or only a portion of the fuses 44 may be cut or destroyed as necessary to change the value of the components to a desired value. Since the trimming occurs from the backside of the semiconductor die 28, it may occur after the semiconductor die 28 has been mounted to the carrier 40. This is important, because as discussed above the carrier 40 may interact with the components 30 in order to undesirably change the operation of a circuit formed with the components 30. Specifically, electromagnetic interactions, mechanical stresses, and the like introduced by the carrier 40 may change the behavior of one or more of the components 30. Accordingly, trimming from the backside may allow for the adjustment of one or more adjustable components in order to compensate for these effects and thus increase the performance thereof.

In addition to the above, performing trimming from the backside of the semiconductor die 28 allows for easier access to metal layers that are formed deeper in the device layer 36, such as a first metal layer (M1). Accordingly, fuses 44 located in these layers closer to the backside of the semiconductor die 28 may be cut or destroyed using less energy, thereby resulting in less damage to the surrounding material. This allows the fuses 44 to be placed closer together, thereby reducing the necessary area required therefore and reducing the overall footprint of the semiconductor die 28. Using the techniques described above for thinning the material between the fuses 44 and the backside of the semiconductor die 28 may further reduce the necessary space between the fuses 44 and therefore further reduce the footprint of the semiconductor die 28.

Figure 6A:
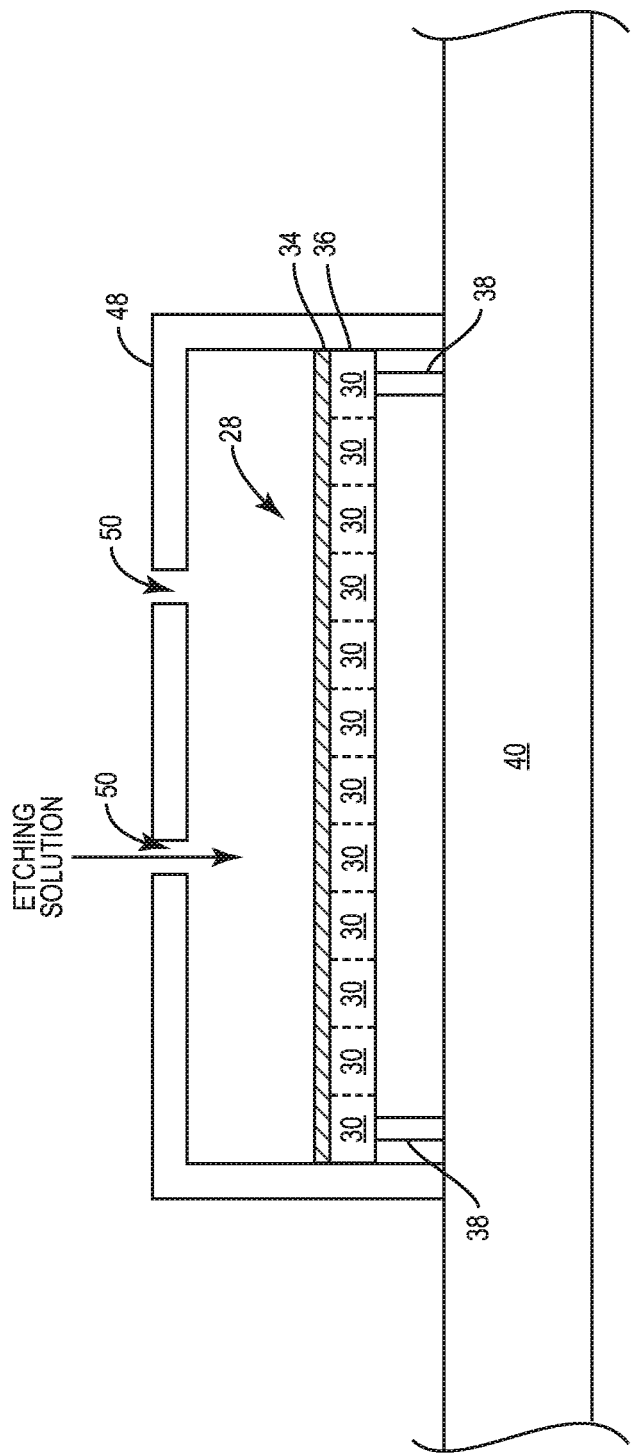
FIGS. 6A through 6C are figures illustrating aspects of a trimming process for a semiconductor die according to one embodiment of the present disclosure.

As discussed above, the substrate 32 of the semiconductor die 28 may be removed in any number of different ways. One way to remove the substrate 32 of the semiconductor die 28 is by surrounding the substrate 32 with a cavity 48 and providing an etching solution through one or more openings 50 into the cavity 48 in order to etch away the substrate 32, as illustrated in FIG. 6A. Due to the different materials of the substrate 32 and the insulating layer 34 or the substrate 32 and the device layer 36 (in the case of a non-SOI semiconductor die), an etchant configured to remove only the substrate 32 is provided. Accordingly, the substrate 32 can be removed.

Figure 6B:
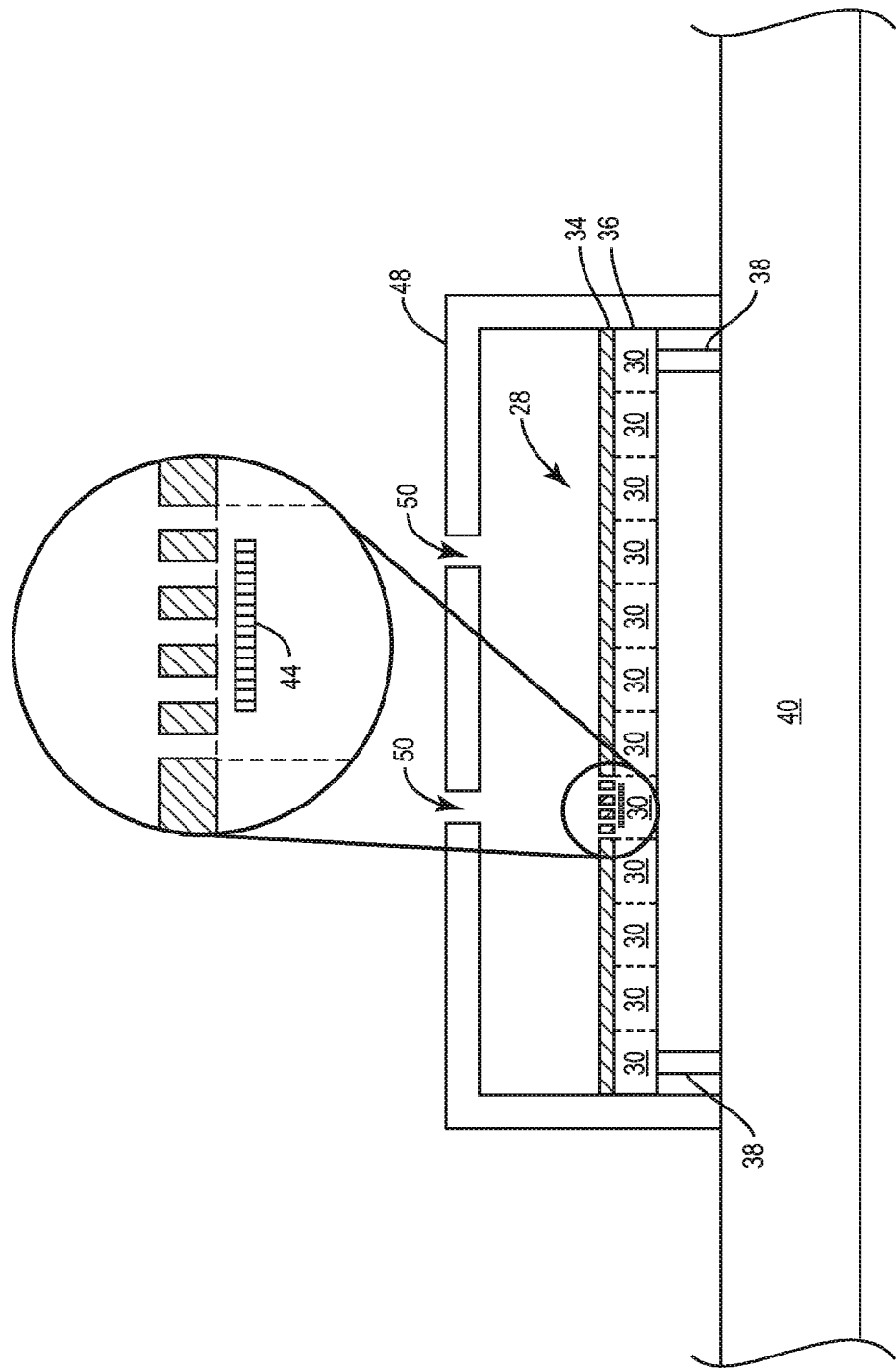

In some embodiments, the etching of the substrate 32 and thinning of the material between the backside of the semiconductor die 28 and a fuse 44 of an adjustable component are accomplished at the same time, as illustrated in FIG. 6B. In such an embodiment, the portion of the insulating layer 34 and/or the portion of the device layer 36 located between the fuse 44 and the backside of the semiconductor die 28 are patterned during manufacturing such that gaps are formed therein. These gaps may be filled with the same material or a similar material used to form the substrate 32, and may be created using masking and deposition techniques, or any other suitable techniques (e.g, a backside contact process). As the etchant is provided into the cavity 48, the substrate 32, the portion of the insulating layer 34 and/or the portion of the device layer 36 above the fuse 44 are etched away, such that the material between the fuse 44 and the backside of the semiconductor die 28 is thinned as discussed above. Accordingly, the damage caused by trimming of the fuse 44 can be significantly reduced or eliminated.

Figure 6C:
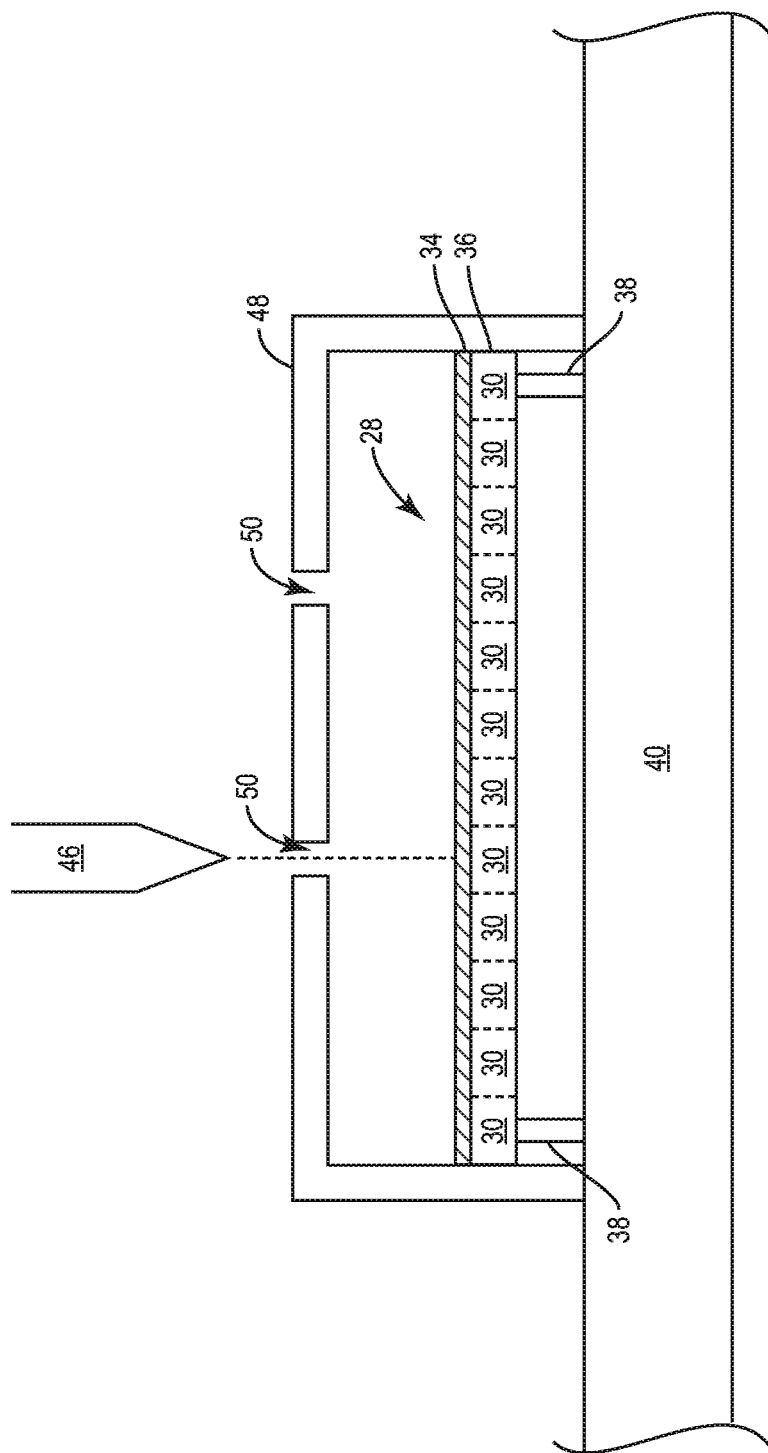

In some embodiments, the cavity 48 may persist after etching away the substrate 32, and thus may interfere with trimming of one or more adjustable components in the semiconductor die 28. Accordingly, in one embodiment the openings 50 in the cavity 48 are provided over the fuses 44 in the one or more adjustable components such that the laser 46 can be directed through the openings 50 in order to trim the adjustable components, as illustrated in FIG. 6C. Any number of openings 50 may be provided as necessary to provide access to the fuses 44 of any number of adjustable components. After trimming of the one or more adjustable components, the cavity 48 may be filled with a high-resistivity encapsulant material, or may simply be left empty. The openings 50 in the cavity 48 may also be sealed if desired.

Figure 7B:
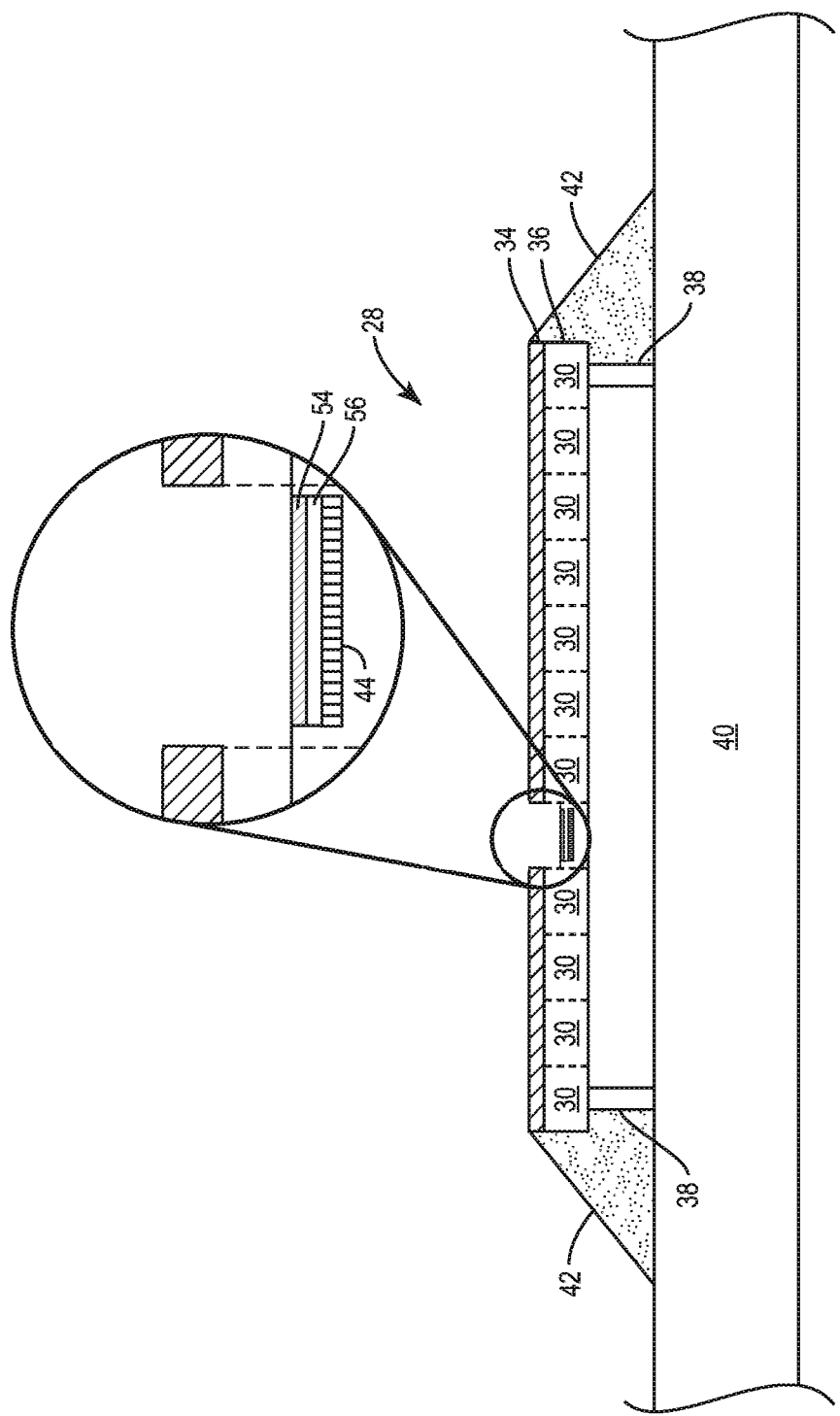
Figure 7C:
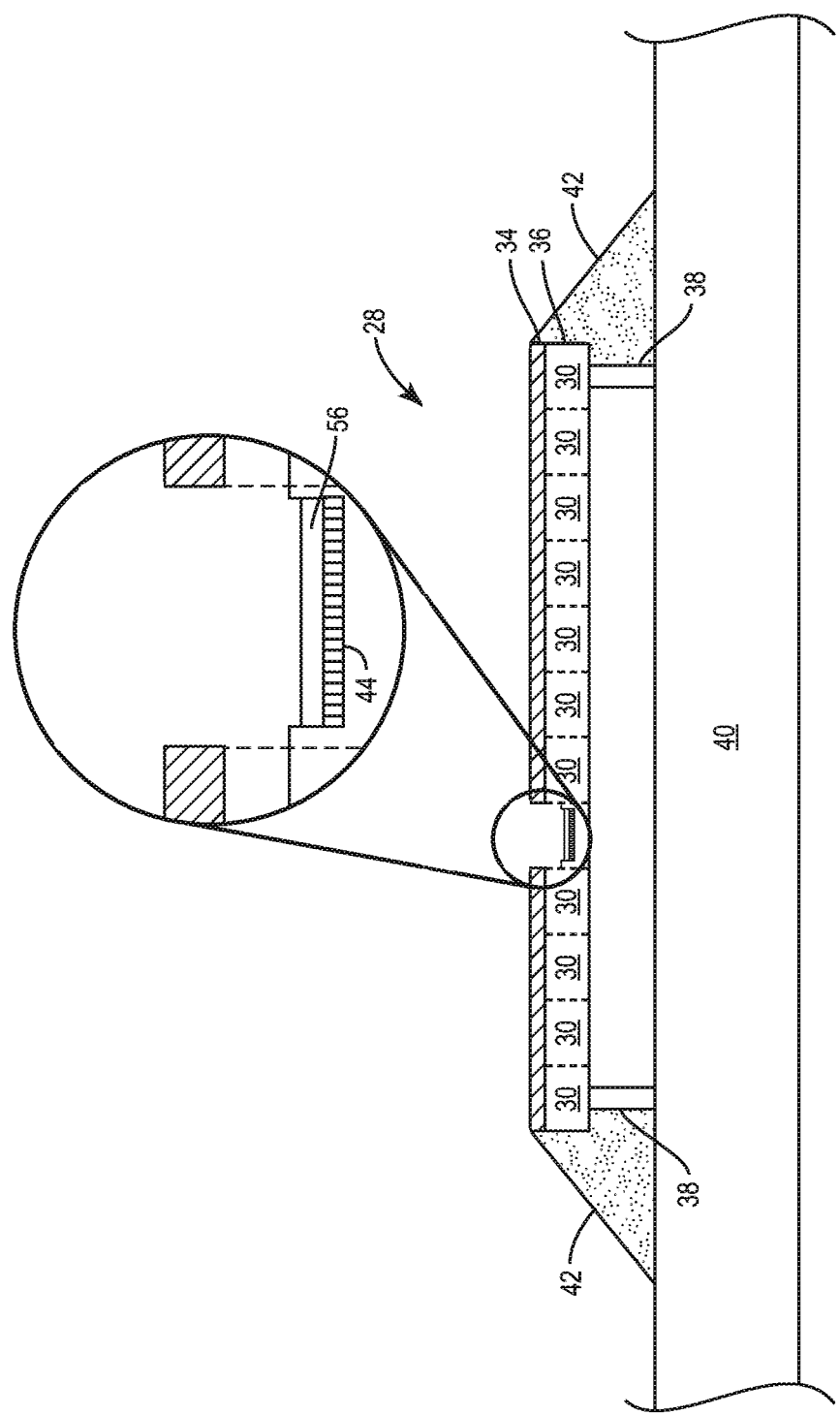

In some embodiments, one or more backside contacts may exist in the semiconductor die 28. A backside contact may include a number of contact channels through the insulating layer 34 and the substrate 32, as shown in FIG. 7A. An active semiconductor portion 52 may be positioned between a silicide layer 54 and the insulating layer 34. A contact layer 56 may be between the fuse 44 (or any portion of a metal layer) and the silicide layer 54 such that the fuse 44 may be connected to one or more components via the backside of the device. To avoid the aforementioned problems associated with fuse trimming such as explosions that disrupt nearby components, all or a portion of the insulating layer 34 and the active semiconductor portion 52 may be etched away above the fuse 44 after removal of the substrate 32 as shown in FIG. 7B. In other embodiments, the silicide layer 54, the contact layer 56, or both may additionally be removed such that the contact layer 56 and/or the fuse 44 are directly exposed to the outside environment as shown in FIG. 7C. As discussed above, thinning the material between the fuse 44 and the environment in the manner prevents damage to nearby components that may otherwise occur during trimming of the fuse 44.

Those skilled in the art will recognize improvements and modifications to the embodiments of the present disclosure. All such improvements and modifications are considered within the scope of the concepts disclosed herein and the claims that follow.

What is claimed is:

1. A method comprising:
   providing a semiconductor die, the semiconductor die comprising:
   a substrate comprising a first side and a second side opposite to the first side;
   a device layer over the first side of the substrate such that the device layer is closer to the first side than the second side, wherein a surface of the device layer opposite the substrate is a frontside of the semiconductor die; and
   an adjustable component in the device layer, wherein the adjustable component comprises at least one fuse;
   removing at least a portion of the second side of the substrate to expose a backside of the semiconductor die opposite the frontside;
   thinning at least a portion of material located between the backside of the semiconductor die and the at least one fuse; and
   subsequently trimming the adjustable component from the backside of the semiconductor die.

2. The method of claim 1 wherein trimming the adjustable component from the backside of the semiconductor die comprises using a laser to break a connection formed by the at least one fuse in the adjustable component.

3. The method of claim 2 wherein breaking the connection formed by the at least one fuse in the adjustable component causes a change in one or more of a resistance, a capacitance, an inductance, and a size of the adjustable component.

4. The method of claim 1 wherein thinning at least a portion of the material located between the backside of the semiconductor die and the at least one fuse before trimming the adjustable component from the backside of the semiconductor die comprises removing all of the material over the at least one fuse such that the at least one fuse is exposed to the outside environment through the backside of the semiconductor die.

5. The method of claim 1 further comprising mounting the semiconductor die to a carrier before trimming the adjustable component from the backside of the semiconductor die, wherein the semiconductor die is mounted to the carrier such that the device layer is between the substrate and the carrier.

6. The method of claim 5 wherein trimming the adjustable component from the backside of the semiconductor die comprises using a laser to break a connection formed by the at least one fuse in the adjustable component.

7. The method of claim 6 wherein breaking the connection formed by the at least one fuse in the adjustable component causes a change in one or more of a resistance, a capacitance, an inductance, and a size of the adjustable component.

8. The method of claim 1 wherein the semiconductor die is a silicon-on-insulator (SOI) semiconductor die in which the substrate is separated by the device layer by an insulating layer and a surface of the insulating layer opposite the device layer is the backside of the semiconductor die.

9. The method of claim 1 wherein removing at least a portion of the second side of the substrate comprises:
providing a cavity surrounding the substrate; and
providing an etching solution into the cavity via one or more holes in the cavity over the backside of the semiconductor die.

10. The method of claim 9 wherein the one or more holes in the cavity are aligned with the at least one fuse in the adjustable component such that a laser may be used to break a connection formed by the at least one fuse by directing the laser through the one or more holes in the cavity.

11. A method comprising:
providing a semiconductor die comprising an adjustable component in a device layer of the semiconductor die, wherein a surface of the device layer is a frontside of the semiconductor die that is opposite a backside of the semiconductor die, and wherein the semiconductor die further comprises an insulating layer and wherein the device layer is over the insulating layer;
flip-chip mounting the semiconductor die to a carrier wherein the frontside of the semiconductor die is adjacent the carrier;
thinning at least a portion of the insulating layer from the backside of the semiconductor die located between at least one fuse in the adjustable component and a backside surface of the semiconductor die; and
trimming the adjustable component from the backside of the semiconductor die.

12. The method of claim 11 wherein trimming the adjustable component from the backside of the semiconductor die comprises using a laser to break a connection formed by the at least one fuse in the adjustable component.

13. The method of claim 12 wherein using the laser to break the connection formed by the at least one fuse in the adjustable component causes a change in one or more of a resistance, a capacitance, an inductance, and a size of the adjustable component.

14. The method of claim 11 wherein thinning at least a portion of the insulating layer from the backside of the semiconductor die located between the at least one fuse in the adjustable component and the backside surface of the semiconductor die comprises etching at least a portion of the insulating layer located between the at least one fuse in the adjustable component and the backside surface of the semiconductor die.

15. The method of claim 11 wherein thinning at least a portion of the insulating layer from the backside of the semiconductor die located between the at least one fuse in the adjustable component and the backside surface of the semiconductor die comprises removing all of the insulating layer located over the at least one fuse in the adjustable component such that the at least one fuse is exposed to the outside environment through the backside of the semiconductor die.

16. The method of claim 11 wherein the semiconductor die comprises a substrate and the device layer is over the substrate, wherein a surface of the device layer opposite the substrate is the frontside of the semiconductor die.

17. The method of claim 16 further comprising simultaneously removing at least a portion of the substrate to expose the backside of the semiconductor die opposite the frontside of the semiconductor die and thinning at least a portion of the insulating layer from the backside of the semiconductor die located between the at least one fuse in the adjustable component and the backside surface of the semiconductor die.

18. The method of claim 16 wherein trimming the adjustable component from the backside of the semiconductor die comprises directing a laser at the at least one fuse through the backside of the semiconductor die.

* * * * *